United States Patent [19]
Kikuchi et al.

[11] Patent Number: 5,955,901
[45] Date of Patent: Sep. 21, 1999

[54] WAVE SHAPING CIRCUIT OF SEMICONDUCTOR TESTING APPARATUS

[75] Inventors: Makoto Kikuchi; Kiyotaka Mizuno, both of Tokyo, Japan

[73] Assignee: Ando Electric Co., Ltd., Tokyo, Japan

[21] Appl. No.: 09/026,175

[22] Filed: Feb. 19, 1998

[30] Foreign Application Priority Data

Feb. 28, 1997 [JP] Japan ................................ 9-091413

[51] Int. Cl.⁶ ............................................. H03B 21/00
[52] U.S. Cl. ........................... 327/107; 327/100; 324/617
[58] Field of Search .................................. 327/291, 295, 327/298, 299, 172, 173, 174, 175, 176, 105, 107, 100; 324/617

[56] References Cited

U.S. PATENT DOCUMENTS

| | | | |
|---|---|---|---|
| 5,150,068 | 9/1992 | Kawashima et al. | 327/145 |
| 5,406,132 | 4/1995 | Housako | 327/172 |
| 5,418,485 | 5/1995 | Duret et al. | 327/172 |
| 5,465,066 | 11/1995 | Yamashita et al. | 327/294 |
| 5,717,352 | 2/1998 | Ebiya | 327/166 |
| 5,777,500 | 7/1998 | Eitrheim | 327/174 |

*Primary Examiner*—Kenneth B. Wells
*Assistant Examiner*—Hai L. Nguyen
*Attorney, Agent, or Firm*—Flynn, Thiel, Boutell & Tanis, P.C.

[57] ABSTRACT

A wave shaping circuit for a semiconductor device testing apparatus reduces discrepancies in timing of signals by shortening lengths of signal transmission paths. The scale of the circuit is restrained by reducing the number of connecting lines between a modulation waveform generator and buffer circuits. A set signal and a reset signal generated by the modulation waveform generator are input to a first wave shaping SR register which produces a single pattern waveform to be applied to devices under test. The single pattern waveform is multiplied n-fold by the buffer circuit. Signals from the buffer circuit are received by invert/noninvert circuits which provide invert signals and noninvert signals. Differential circuits receive the invert/noninvert signals to generate set signals and reset signals having minimal discrepancies in timing which are input to second wave shaping SR registers. The wave shaping SR registers thus produce n occurrences of pattern waveforms having the same pulse width for a plurality of devices under test.

6 Claims, 3 Drawing Sheets

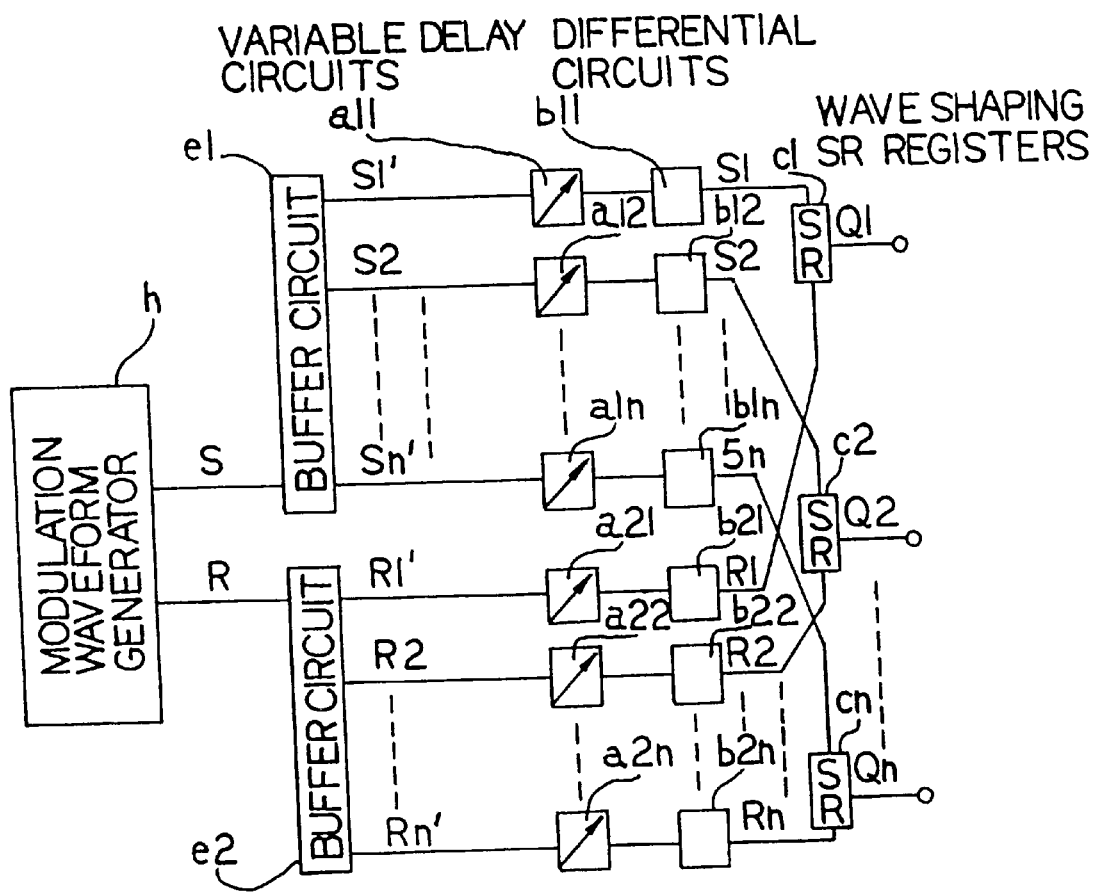

WAVE SHAPING CIRCUIT OF SEMICONDUCTOR TESTING APPARATUS

BACKGROUND OF THE INVENTION

1. Field of the Invention

The invention relates to a wave shaping circuit of a semiconductor device testing apparatus, and particularly, to a wave shaping circuit for ultimate waveforms in a waveform generating circuit of the semiconductor device testing apparatus, for applying a pattern waveform to a plurality of semiconductor devices under test.

2. Prior Art

A wave shaping circuit of a conventional semiconductor device testing apparatus has an arrangement as shown in FIG. 3 by way of example.

The wave shaping circuit comprises a modulation waveform generator h, buffer circuits e1, and e2, variable delay circuits a11~a1n, and a21~a2n, differential circuits b11~b1n, and b21~b2n, and wave shaping SR registers, e.g. SR flip-flop c1~cn.

In these circuits, the modulation waveform generator h generates a set signal S and a reset signal R, inputting the set signal S to the buffer circuit e1 while inputting the reset signal R to the buffer circuit e2.

The buffer circuits e1 and e2 output n-fold signals S1'~Sn', and R1'~Rn', respectively, whereupon the n-fold signals S1'~Sn', and R1'~Rn' are inputted to the differential circuits b11~b1n, and b21~b1n, respectively, via the variable delay circuits a11~a1n, and a21~a2n, causing output signals therefrom S1~Sn, and R1~Rn, respectively, to be inputted to the wave shaping registers c1~cn.

This enables adjustment of rising and falling, respectively, of pattern waveforms Q1~Qn to be applied to semiconductor devices (not shown) under test.

The conventional technology as shown in FIG. 3, however, has the following problems.

More specifically, with the semiconductor device testing apparatus, measurement is performed on a plurality of semiconductor devices under test simultaneously instead of on a single semiconductor device to enhance measurement efficiency.

In this case, according as the number of pins of the devices under test, and the number of the devices under test increase, the number of the modulation waveform generators h increase along with the number of the buffer circuits e1, and e2, respectively.

Consequently, in the conventional arrangement as shown in FIG. 3, transmission paths for signals from the modulation waveform generator h to the wave shaping SR resistors c1~cn become longer in length, increasing deviation in timing between the signals S1~Sn and the signals R1~Rn which are inputted to the wave shaping SR registers c1~cn, respectively.

For example, the signal R1 inputted to the wave shaping SR registers c1 is obtained by inputting the signal R generated in the modulation waveform generator h to the buffer circuit e2, and by transmitting the signal R1 obtained therefrom via the variable delay circuit a21 and the differential circuit b21.

Accordingly, as is obvious from FIG. 3, a transmission path for the signal R1 from the modulation waveform generator h to the wave shaping SR register c1 is longer than that for the other signal S1, resulting in large discrepancy in timing between the signals S1 and R1.

Such discrepancy needs to be minimized as much as possible due to a demand for high precision in timing accompanying speed-up in operation of devices under test.

Furthermore, the larger the magnitude of deviation in the timing, the greater the scales of the variable delay circuits a11~a1n, and a21~a2n become to compensate for the deviation.

In addition, as shown in the figure, as two connecting lines are required between the modulation waveform generator h and the buffer circuits e1 and e2, one for the set signal S and the other for the reset signal R, the number of the connecting lines needs to be further increased in case that a plurality of the modulation waveform generators h are required.

SUMMARY OF THE INVENTION

The invention provides a wave shaping circuit of a semiconductor device testing apparatus with minimum discrepancy in timing of signals by shortening the lengths of signal transmission paths, and with a restrained scale of circuits by reducing the number of connecting lines between the modulation waveform generator and the buffer circuits.

As shown in FIGS. 1 and 2, the problems described in the foregoing are solved by the wave shaping circuit of the semiconductor device testing apparatus according to the invention wherein a set signal S and a reset signal R outputted by a modulation waveform generator h are shaped into a single output pattern waveform P by a first wave shaping SR register f, the single output pattern waveform P is multiplied by n, the output pattern waveforms P multiplied n-fold are made variable in timing by variable delay circuits a11~a1n, and a21~a2n via invert/noninvert circuits d1~dn, and signals with minimum discrepancy in timing S1~Sn, and R1~Rn, produced via differential circuits b11~b1n, and b21~b2n, respectively, are inputted to second wave shaping SR registers c1~cn.

In the arrangement of the invention, two signals, that is, the set signal S and the reset signal R {in FIGS. 2, (A) and (B)} outputted by the modulation waveform generator h are shaped into the single output pattern waveform P {in FIG. 2, (C)} by the first wave shaping SR registers f, and n occurrences of the pattern waveforms P1~Pn, {in FIGS. 2, (D), (K), and the like} are obtained by multiplying the single output pattern waveform P n-fold in the buffer circuit e. The n occurrences of the pattern waveforms P1~Pn are inputted to the invert/noninvert circuits d1~dn, respectively, and noninvert signals P11~P1n and invert signals P21~P2n {in FIGS. 2, (E), (F), and the like} outputted therefrom are sent out to variable delay circuits a11~a1n and a21~a2n, and further to differential circuits b11~b1n and b21 and b2n, producing output signals S1~Sn and R1~Rn {in FIGS. 2, (G), (H), and the like}. Pattern waveforms Q1~Qn {in FIGS. 2, (J), (O), and the like} to be applied to semiconductor devices under test are obtained by inputting the signals S1~Sn and R1~Rn to second wave shaping SR registers c1~cn for shaping of waveforms.

Thus, a circuit configuration is made compact by outputting the single output pattern waveform P through shaping of the set signal S and the reset signal R, delivered from the modulation waveform generator h, via the first wave shaping SR register f, and by multiplying same n-fold via the buffer circuit e, shortening lengths of transmission paths of the signals with the result that discrepancy in timing between the signals S1~Sn and the signals R1~Rn, to be inputted to the second wave shaping SR registers c1~cn can be minimized.

Further, as the number of the connecting lines between the modulation waveform generator h and the buffer circuits e is halved by integrating the connecting lines into one, interfacing between the modulation waveform generator h and the buffer circuits e is simplified even when the number of the modulation waveform generator h is increased.

BRIEF DESCRIPTION OF THE DRAWINGS

FIG. 3 is a schematic illustration of a conventional wave shaping circuit.

PREFERRED EMBODIMENTS OF THE INVENTION

The invention is described in greater detail hereinafter with reference to accompanying drawings.

Figure 1:
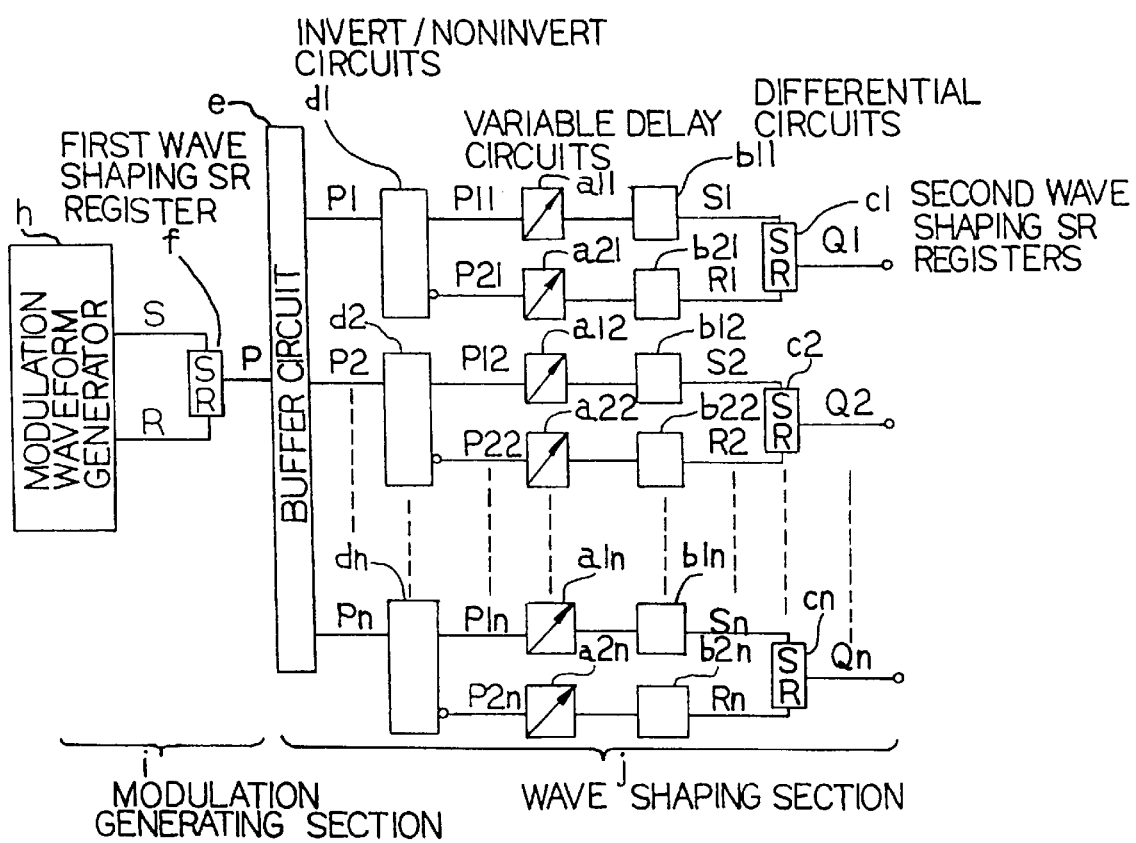
FIG. 1 is a block diagram of an embodiment of a wave shaping circuit according to the invention.
Figure 2:
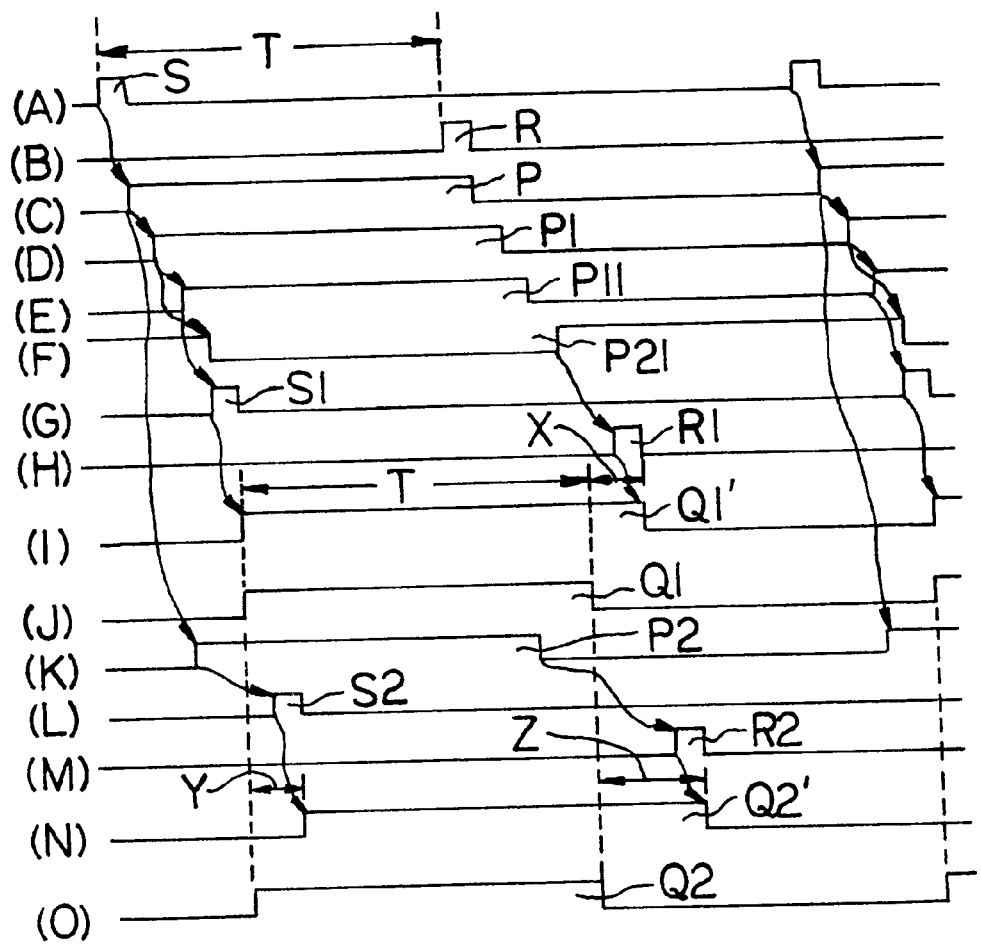
FIG. 2 is a time chart of respective signals in FIG. 1.

FIG. 1 is a block diagram of an embodiment of a wave shaping circuit according to the invention, and FIG. 2 a time chart of respective signals in the circuits shown in FIG. 1.

The wave shaping circuit shown in FIG. 1 comprises a modulation generating section i for outputting a single pattern wave form P {(in FIG. 2, (C)} and a wave shaping section j for shaping signals into pattern waveforms Q1~Qn {in FIGS. 2, (J), (O), and the like} to be applied to semiconductor devices (not shown) under test.

The modulation generating section i comprises a modulation waveform generator h and a first wave shaping SR register f, while the wave shaping section j comprises a buffer circuit e, invert/noninvert circuits d1~dn, variable delay circuits, a11~a1$n$ and a21~a2$n$, differential circuits, b11~b1$n$ and b21~b2$n$, and second wave shaping SR resistors c1~cn, respectively.

The modulation waveform generator h is provided with a pattern generating unit (not shown), a timing circuit (not shown), and a controller (not shown), outputting a set signal S {in FIG. 2, (A)}, and a reset signal R {in FIG. 2, (B)}, constituting the basis for the pattern waveforms Q1~Qn shaped in the second wave shaping SR registers c1~cn as described in detail hereinafter.

The first wave shaping SR register f is fed with the set signal S and the reset signal R outputted from the modulation waveform generator h, and outputs the single pattern waveform P.

The buffer circuit e is fed with the single pattern waveform P, and outputs n occurrences of pattern waveforms P1~Pn by multiplying same n-fold.

The n occurrences of the pattern waveforms P1~Pn are input to the invert/noninvert circuits d1~dn, outputting noninvert signals p11~P1$n$, and invert signals P21~P2$n$, which are positioned close to each other, respectively.

The variable delay circuits a11~a1$n$, and a21~a2$n$ are fed with the noninvert signals p11~P1$n$, and invert signals P21~P2$n$, turning timings of these signals variable.

The differential circuits b11~b1$n$, and b21~b2$n$ are fed with variable signals p11~P1$n$, and P21~P2$n$, output from the variable delay circuits a11~a1$n$, and a21~a2$n$, respectively, and differentiate the signals, outputting set signals S1~Sn, and reset signals R1~Rn, with minimum discrepancy in timing.

The second wave shaping SR registers c1~cn are fed with the set signals S1~Sn, and reset signals R1~Rn, adjusted in timing thereof, and delivered from the differential circuits b11~b1$n$, and b21~b2$n$, outputting n occurrences of the pattern waveforms Q1~Qn to be applied on semiconductor devices under test.

Now, operation of the wave shaping circuit according to the invention arranged as described in the foregoing is explained hereinafter with reference to FIG. 2.

Firstly, the modulation waveform generator h outputs the set signal S {in FIG. 2, (A)}, and the reset signal R {in FIG. 2, (B)}, the two signals are shaped into the single pattern wave form P (C) as shown in FIG. 2 via the first wave shaping SR register f, and multiplied n-fold by the buffer circuit e, producing n occurrences of the pattern waveforms P1~Pn {in FIGS. 2, (D), (K), and the like}.

In this case, T denotes a period of the single pattern waveform P delivered from the first wave shaping SR register f {(in FIG. 2, (C)}.

Then, the invert/noninvert circuits d1~dn are formed by, for example, common input OR/NOR gates, and the noninvert signals p1~P1$n$ {in FIG. 2, (E)}, and the invert signals P21~P2$n$ {in FIG. 2, (F} which are positioned close to the former, respectively, are produced by inputting n occurrences of the pattern waveforms P1~Pn to the invert/noninvert circuits d1~dn.

Subsequently, the set signals S1~Sn, and the reset signals R1~Rn produced by delivering the noninvert signals p11~P1$n$, and the invert signals P21~P2$n$ via the variable delay circuits a11~a1$n$, and a21~a2$n$, and further, via the differential circuits b11~b1$n$, and b21~b2$n$ are inputted to the second wave shaping registers c1~cn, shaping waveforms.

In this case, the n occurrences of the pattern waveforms P1~Pn {in FIGS. 2, (D), (K)}, output from the buffer circuit e, have delay in timing to an extent of transmission paths of respective signals and a length of the buffer circuit e in comparison with a timing of the single pattern waveform P output from the first wave shaping SR register f.

The noninvert signals P11~P1$n$ and invert signals P21~P2$n$ {in FIGS. 2, (E), (F) have delay in timing to an extent of transmission paths of respective signals and a length of the respective invert/noninvert circuits d1~dn in comparison with the timing of the pattern waveforms P1~Pn {in FIGS. 2, (D), (K)}, output from the buffer circuit e.

Similarly, respective signals have various amounts of delay in timing depending on respective transmission paths by the time when these are inputted to the second wave shaping registers c1~cn, causing discrepancies in timing.

Hereupon, the following step is taken to compensate for the discrepancies.

That is, an assumption is made that a pulse width of a waveform Q1' outputted from the second wave shaping SR registers c1 is larger than the pulse with T of the single pattern waveform P by x as shown by (I) in FIG. 2 when a length of the variable delay circuits a11=that of a21=a mean value {in FIG. 2, (I)}.

In such a case, the pattern waveform Q1 of a pulse width identical to the pulse width T of the single pattern waveform P is obtained by causing the length of the variable delay circuits a11=the mean value, and the length of the variable delay circuits a21=the mean value minus x.

Similarly, an assumption is made that when a length of the variable delay circuits a12=that of a22=a mean value {in FIG. 2, (N)}, a rising edge of a waveform Q2' outputted from the second wave shaping SR registers c2 is delayed from that of the pattern waveform Q1 by y, and a falling edge of Q2' is delayed from that of Q1 by z.

In such a case, the pattern waveform Q2 rising and falling at the same timing as that for Q1, and of a pulse width identical to the pulse width T of the single pattern waveform P {in FIG. 2, (C)} is obtained by causing the length of the variable delay circuits a12=the mean value minus y, and the length of the variable delay circuits a22=the mean value minus z {in FIG. 2, (O)}.

In a similar fashion, timings of the pattern waveforms Q3~Qn, output from the second wave shaping SR register c3~cn, are coincided with the timing of Q1.

As a result of the operation described above, the pattern waveforms Q1~Qn, output from the second wave shaping SR registers c1~cn, have a pulse width identical to the pulse width T of the pattern waveform P output from the first wave shaping registers f, and output timings thereof from the second wave shaping SR registers c1~cn are coincided with each other.

This circuit arrangement is made compact by first shaping signals into the single pattern waveform P output from the first wave shaping register f, and by multiplying same n-fold via the buffer circuit e. Also, timing discrepancies are reduced by shortening lengths of transmission paths for signals.

Further, as the number of the connecting lines between the modulation waveform generator h and the buffer circuits e is halved by integrating the connecting lines into one, interfacing between the modulation waveform generator h and the buffer circuits e is simplified even in case of increasing the number of the modulation waveform generator h.

With the wave shaping circuit of a semiconductor device testing apparatus according to the invention, comprising the modulation waveform generator h, the first wave shaping SR register f, the buffer circuit e, the invert/noninvert circuits d1~dn, the variable delay circuits, a11~a1$n$ and a21~a2$n$, the differential circuits, b11~b1$n$ and b21~b2$n$, and the second wave shaping SR registers c1~cn, the signals P11~P1$n$ and same p21~p2$n$ are output close to each other, respectively, resulting in smaller discrepancies in timing between the two groups of signals, and smaller discrepancies in timing of the signals S1~Sn and R1~Rn being input to the second wave shaping SR registers c1~cn with the result that scales of the variable delay circuits can be minimized.

Further, with the invention, the number of the connecting lines between the modulation waveform generator h and the buffer circuits e can be halved, and consequently, a plurality of the modulation generating sections i and the wave shaping sections j can be mounted in one chip, respectively, and connection therebetween can be attained with ease.

In addition, the scale of the circuits is reduced as a result of the number of the buffer circuit being halved.

What is claimed is:

1. A wave shaping circuit of a semiconductor testing apparatus comprising a modulation waveform generator, a first wave shaping SR register, a buffer circuit, invert/noninvert circuits, variable delay circuits, differential circuits, and second wave shaping SR registers, wherein a set signal and a reset signal generated by the modulation waveform generator are input to the first wave shaping SR register, a single pattern waveform output therefrom is multiplied n-fold by the buffer circuit, outputting n occurrences of pattern waveforms, the n occurrences of the pattern waveforms are input to the invert/noninvert circuits, delivering output invert signals and output noninvert signals which are passed through the variable delay circuits to the differential circuits which output set signals and reset signals, the set signals and the reset signals output from said differential circuits are input to the second wave shaping SR registers, producing n occurrences of pattern waveforms having a pulse width equivalent to a pulse width of said single pattern waveform.

2. A wave shaping circuit of a semiconductor testing apparatus comprising:

a modulation generating section for outputting a single pattern waveform; and a wave shaping section for receiving the single pattern waveform and outputting shaping signals as a plurality of pattern waveforms to be applied to semiconductor devices under test, said wave shaping section including:

a plurality of invert/noninvert circuits for receiving multiplied branches of the single pattern waveform and outputting invert signals and noninvert signals;

a plurality of variable delay circuits for receiving the invert signals and the noninvert signals; and a plurality of differential circuits for receiving signals from said variable delay circuits and for outputting set signals and reset signals.

3. The wave shaping circuit of claim 2, wherein said wave shaping section includes a buffer circuit for receiving the single pattern waveform and outputting the multiplied branches of the single pattern waveform to said invert/noninvert circuits.

4. The wave shaping circuit of claim 3, wherein said wave shaping section includes wave shaping SR registers for receiving the set and reset signals from said differential circuits to output the shaping signals as the plurality of pattern waveforms.

5. The wave shaping circuit of claim 4, wherein said modulation generating section includes:

a modulation waveform generator for generating the set signals and the reset signals; and a wave shaping SR register for receiving the set signals and the reset signals from said modulation waveform generator and outputting the single pattern waveform.

6. The wave shaping circuit of claim 2, wherein said modulation generating section includes:

a modulation waveform generator for generating the set signals and the reset signals; and a wave shaping SR register for receiving the set signals and the reset signals from said modulation waveform generator and outputting the single pattern waveform.

* * * * *